United States Patent
Arimilli et al.

(10) Patent No.: US 6,703,866 B1
(45) Date of Patent: Mar. 9, 2004

(54) SELECTABLE INTERFACE FOR INTERFACING INTEGRATED CIRCUIT MODULES

(75) Inventors: Ravi Kumar Arimilli, Austin, TX (US); Daniel Mark Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 527 days.

(21) Appl. No.: 09/740,250

(22) Filed: Dec. 19, 2000

(51) Int. Cl.[7] .................. H03K 19/175; G06F 13/00
(52) U.S. Cl. ............... 326/86; 326/83; 326/30; 710/100; 710/126
(58) Field of Search ............... 326/82, 83, 86, 326/30; 710/100, 126

(56) References Cited

U.S. PATENT DOCUMENTS

| | | | |
|---|---|---|---|
| 5,243,623 A | * | 9/1993 | Murdock .................. 375/220 |
| 5,929,655 A | | 7/1999 | Roe et al. |
| 6,243,776 B1 | * | 6/2001 | Lattimore et al. .......... 710/104 |
| 6,250,936 B1 | * | 6/2001 | Armistead et al. ........... 439/98 |
| 6,448,806 B1 | * | 9/2002 | Roth ......................... 326/16 |

\* cited by examiner

*Primary Examiner*—Vibol Tan
(74) *Attorney, Agent, or Firm*—Casimer K. Salys; Bracewell & Patterson, L.L.P.

(57) ABSTRACT

A selectable interface for interfacing integrated circuit modules is disclosed. The bus interface for interconnecting a first circuit module and a second circuit module includes a transmitter pair located within the first circuit module and a receiver pair located within the second circuit module. The transmitter pair, which can be selectable between a differential mode and a single-ended mode, transmits data from the first circuit module to the second circuit module. The receiver pair, which can also be selectable between a differential mode and a single-ended mode, receives data from the transmitter pair.

4 Claims, 4 Drawing Sheets

SELECTABLE INTERFACE FOR INTERFACING INTEGRATED CIRCUIT MODULES

BACKGROUND OF THE INVENTION

1. Technical Field

The present invention relates to transmission line interfaces in general and, in particular, to transmission line interfaces for interconnecting integrated circuits. Still more particularly, the present invention relates to a selectable interface for interfacing integrated circuit modules.

2. Description of the Prior Art

The operating frequencies of integrated circuits have increased to the point that interconnection between circuit modules require techniques that are more sophisticated than impedance matching and pulse shaping. Typically, driver/receiver circuits use transmission lines that must span distances approaching a fraction of a wavelength at the processing frequencies since the shape of logic pulses is dependent on higher harmonics of the processing frequencies. Either single-ended interfaces or differential interfaces can be found in such driver/receiver circuits.

Both single-ended interfaces and differential interfaces have their advantages or disadvantages. For example, a differential interface requires two connections, which effectively reduces data throughput per wire. However, compared to single-ended interfaces, differential interfaces are usually less susceptible to common-mode noise and can provide a symmetrical load on power supplies and ground returns. Differential interfaces also have relatively better noise immunity because information that causes a state change in a signal line provides a corresponding opposite change in a complementary signal line. In addition, a differential interface is desirable for interconnects that are associated with the hot-insert capable interconnect, as a connector and cables or longer circuit board interconnects are needed to provide the hot insertion capability.

In light of the above, the present disclosure provides an improved interface for interfacing integrated circuit modules.

SUMMARY OF THE INVENTION

In accordance with a preferred embodiment of the present invention, a bus interface for interconnecting a first circuit module and a second circuit module includes a transmitter pair located within the first circuit module and a receiver pair located within the second circuit module. The transmitter pair, which can be selectable between a differential mode and a single-ended mode, transmits data from the first circuit module to the second circuit module. The receiver pair, which can also be selectable between a differential mode and a single-ended mode, receives data from the transmitter pair.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
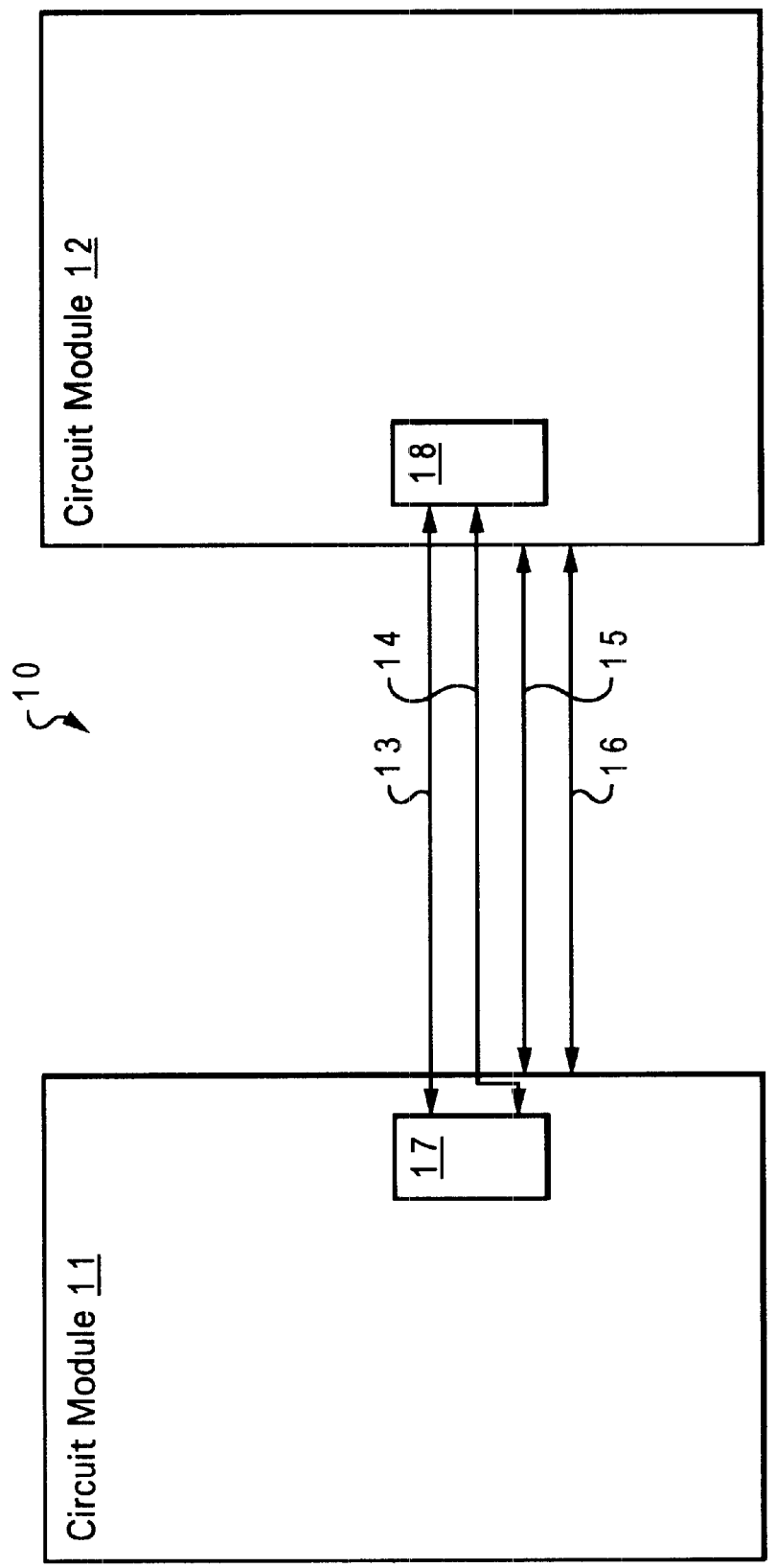
FIG. 1 is a block diagram of a bus interface in accordance with a preferred embodiment of the present invention.

Referring now to the drawings and, in particular, to FIG. 1, there is depicted a block diagram of a bus 5 interface in accordance with a preferred embodiment of the present invention. As shown, a bus interface 10 includes a circuit module 11 coupled to a circuit module 12 via transmission lines 13–16. In this implementation, transmission lines 13 are multiple data lines, transmission lines 14 are handshaking lines, and transmission lines 15, 16 are signal lines. Circuit module 11 and circuit module 12 represents various types of configurations. For example, circuit module 11 and circuit module 12 may be circuit blocks within an integrated circuit requiring transceivers for communication due to long circuit paths. Circuit module 11 and circuit module 12 may be integrated circuits such as chips within a multi-chip module (MCM). Circuit module 11 and circuit module 12 may also be system components connected via rack connections. Circuit module 11 may even be a multiprocessor system mounted on a system board, and circuit module 12 is a hot-pluggable processor capable of connecting to the multiprocessor system via relatively long cables and connectors.

Transmitter pair 17 provide signals in data transmission lines 13. Data transmission lines 13, which are arranged in a pairs, carry data from circuit module 11 to circuit module 12. Transmitter pair 17 support both single-ended and differential modes of transmission on data transmission lines 13, and the mode is individually selectable in pairs of multiple data transmission lines 13. Similarly, transmitter pair 18 provide signals in handshaking transmission lines 14. Handshaking signals in handshaking transmission lines 14 are shown separately to illustrate that while data signals in transmission lines 13 are provided in single-ended mode, all or part of handshaking signals in transmission lines 14 may be provided in differential mode, but any combination of differential and single-ended modes may be selected for each of the transmission line pairs. Signals in transmission lines 15 and 16 are depicted to show that a bi-directional interface is supported by including transmitters and receivers in circuit modules 11 and 12.

Figure 2:
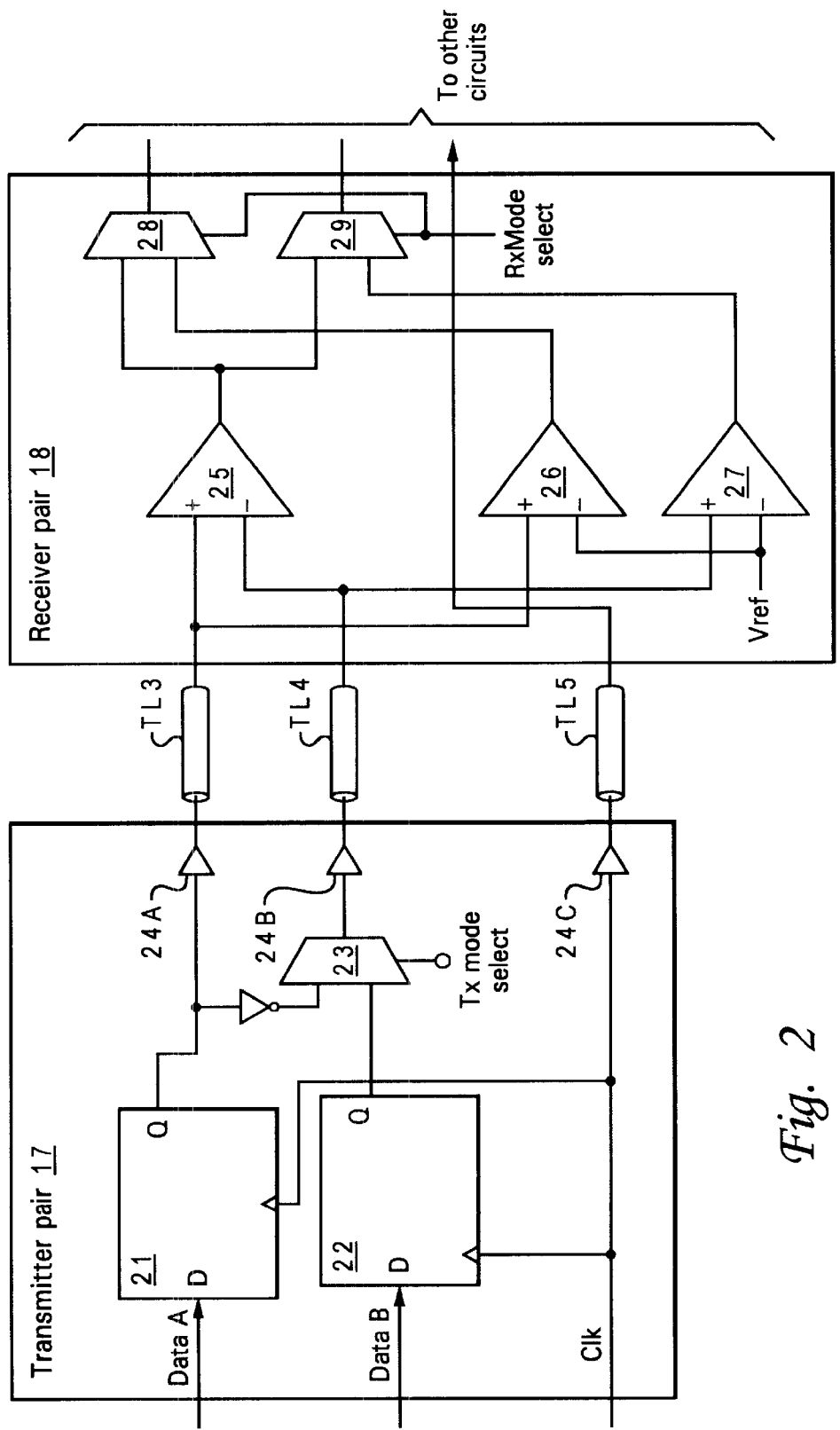
FIG. 2 is a schematic diagram of a transmitter pair and a receiver pair within the bus interface from FIG. 1, in accordance with a preferred embodiment of the present invention.

With reference now to FIG. 2, there is illustrated a schematic diagram of a transmitter pair and a receiver pair within bus interface 10, in accordance with a preferred embodiment of the present invention. As shown, transmitter pair 17 includes a latch 21, a latch 22, and a multiplexor 23. Transmitter pair 17 receives a data A signal, a data B signal, and a Clk signal. On the rising edge of the Clk signal, latch 21 latches the data A signal, and latch 22 latches the data B signal. Output driver 24A always receives the output of latch 21. Multiplexor 23 is used to select between a differential mode and a single-ended mode. When a TxMode select signal is in a logical low state, output driver 24A receives the output of latch 21 to provide a single-ended representation of the data A signal on transmission line TL3, and a single-ended representation of the data B signal on transmission line TL4. When the TxMode select signal is in a logical high state, output driver 24B receives the complement of the output of latch 21 to provide an inverted representation of the data A signal on transmission line TL4 to allow for a differential mode of operation. During the differential mode, data B is ignored so the input data from other blocks will have to be routed to data A input only.

Mode selection can be accomplished via programmable registers, providing mode select bits for the pairs of transmission lines used within a bus interface. Mode selection can also be accomplished by a detector coupled to the transmission lines for detecting environmental characteristics of the transmission lines. The mode selection control signal can also be coupled to a pre-compensation control for tailoring output driver 24A and 24B characteristics for single-ended mode or differential mode.

Transmission line signals TL3 and TL4 are coupled to receiver pair 18 that is located in circuit module 12 (from FIG. 1). Receiver pair 18 include comparators 25–27 and multiplexors 28–29. Comparator 25 compares the received signals to decode a differential signal. Comparator 26 and comparator 27 compare the received signals to reference voltage Vref to decode single-ended signals. Multiplexor 28 selects between the differential decoded output of comparator 25 or the single-ended decode of the TL3 signal from comparator 26, while multiplexor 29 selects between the differential decoded output of comparator 25 or the single-ended decode of the TL4 signal from comparator 26. The mode of operation of receiver pair 18 is selected by a RxMode select signal, which can be provided by a programmable register, a selection pin or other means. The outputs of receiver pair 18 can then be coupled to an interface that can synchronize the received data to the local clocks for use within circuit module 12.

Figure 3:
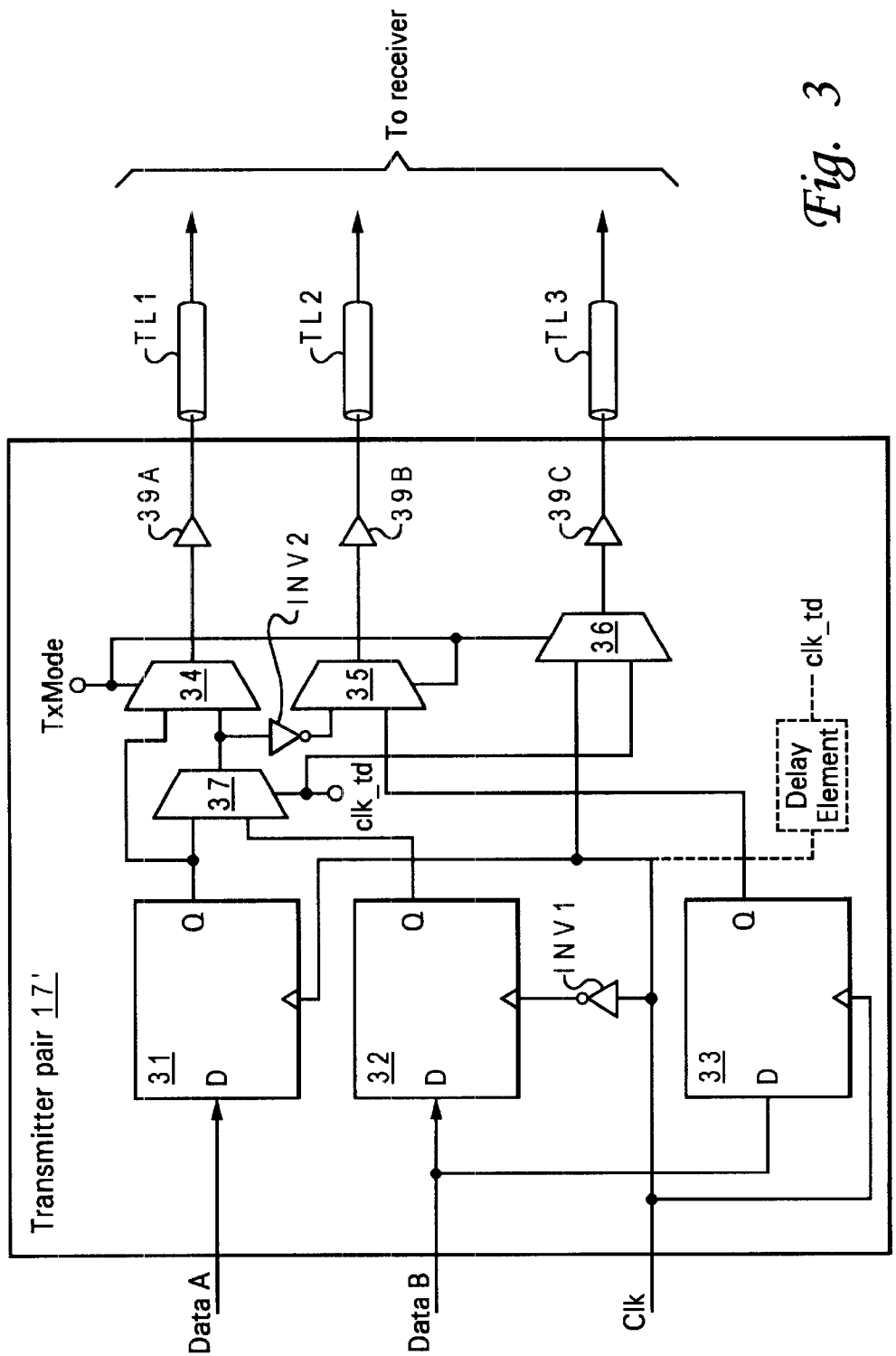
FIG. 3 is a schematic diagram of a receiver pair within the bus interface from FIG. 1, in accordance with an alternative embodiment of the present invention.

Referring now to FIG. 3, there is depicted a schematic diagram of a transmitter pair within bus interface 10, in accordance with an alternative embodiment of the present invention. A transmitter pair 17' includes latches 31–33, multiplexors 34–37, and drivers 39A–39C. Latch 31 latches the Data A signal value on the rising edge of Clk, and latch 32 latches the Data B signal value on the rising edge of the output of an inverter INV1, which is an inverted version of the Clk signal. Multiplexor 37 is controlled by a clk_td signal, which is a delayed version of the Clk signal which may be supplied external to transmitter pair 17' or may be produced by incorporating a delay element coupled to the Clk signal.

Multiplexor 34 is controlled by signal TxMode, which selects between differential and single-ended transmission modes. When the TxMode signal is in a logic low state, multiplexor 34 selects the output of latch 31, providing a representation of the Data A signal to output driver 39A, which is coupled to transmission line TL1. Similarly latch 33 latches the Data B signal on the rising edge of Clk, producing a representation of the Data B signal that is latched in-phase with the Data A representing output of latch 31. Multiplexor 35 selects the output of latch 33 when the TxMode signal is in a logic low state. The output of multiplexor 35 is coupled to an output driver 39B, which is coupled to transmission line TL2. Thus, when the TxMode signal is in the low logic state, single-ended mode is selected and TL1 carries a representation of the Data A signal, while TL2 carries a representation of the Data B signal.

When the TxMode signal is in a logic high state, multiplexor 34 selects the output of multiplexor 33, which is alternating according to the state of the clk_td signal between the output of latch 31 and the output of latch 32. In this mode, the output on transmission line TL1 will be alternatively be a representation of the Data A signal or the Data B signal, according to the phase of the clk_td signal. Simultaneously, multiplexor 35 selects an inverted version of the output of multiplexor 33 provided by an inverter INV2. Thus, when the TxMode signal is in the logic high state, differential mode is selected. The clock frequency has been doubled, since the data will alternate between Data A and Data B representations, maintaining the same overall data rate for both single-ended and differential modes.

The Clk signal is also provided to the interface via transmission line TL3. When the TxMode signal is in a logic low state (single-ended mode) the Clk signal is provided through multiplexor 36 to output driver 39C that is coupled to transmission line TL3. When the TxMode signal is in the logic high state (differential mode), the clk_td signal is provided to output driver 39C. Using the clk_td signal ensures that the synchronous clock supplied over transmission line TL3 is compatible with the differential data signals on transmission lines TL1 and TL2, since differential mode data is multiplexed by multiplexor 33 which is controlled by the clk_td signal.

Figure 4:
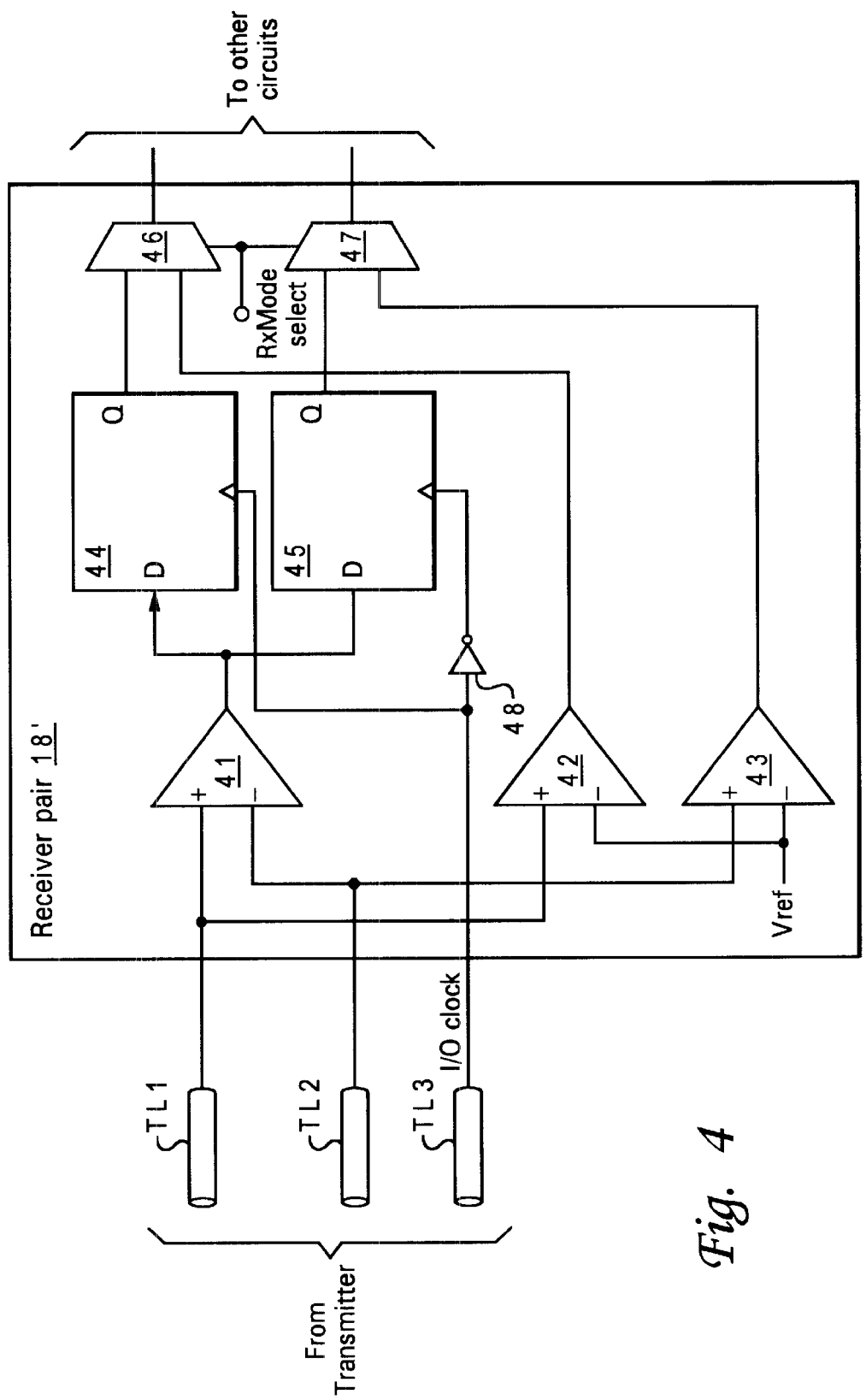
FIG. 4 is a schematic diagram of a receiver pair within the bus interface from FIG. 1, in accordance with an alternative embodiment of the invention.

With reference now to FIG. 4, there is depicted a schematic diagram of a receiver pair within bus interface 10, in accordance with an alternative embodiment of the present invention. A receiver pair 18' includes comparators 41–43, latches 44–45, and multiplexors 46–47. A differential comparator 41 detects the difference between the signals present on transmission lines TL1 and TL2. The output of differential comparator 41 is latched by latch 44 on the rising edge of a delayed I/O clock signal received via a transmission line TL3. The output of differential comparator 41 is also latched on the falling edge of the I/O clock signal by latch 45, since the clock signal to latch 45 is inverted by inverter 48. Latch 44 and latch 45 outputs are selected by multiplexor 46 and multiplexor 47 when signal RxMode is in a high logic state, detecting differential mode signals received from transmission lines TL1 and TL2. When signal RxMode is in the low logic state, the outputs of a level comparator 42 and a level comparator 43 are selected by multiplexors 46 and 47, decoding a single ended-data.

While the transmission line pair depicted in FIG. 3 and FIG. 4 is a circuit in which the data rate is held uniform over the operational modes for a given input frequency, there is no limitation of the operation of these circuits to a 2:1 ratio or a 1:1 ratio as in the circuits of FIG. 2. The clock frequency that is input to the transmitter (and thus the receiver) blocks can be supplied at different rates for the different modes, allowing optimization of the operating frequency for each mode. For example, the noise immunity provided in a particular application by the differential mode may allow operation in some circuits at several times the maximum frequency in single-ended mode, or for another application, the bandwidth of the transmission lines may limit the operating frequency in differential mode such that twice the single-ended maximum frequency is not possible for differential mode. In the latter case, the clock must be "throttled back" to a lower value, reducing the effective data rate of the interface over single-ended mode, but providing the lower power or the more reliable operation available in differential mode.

The transmitter pair of FIG. 3 and receiver pair circuits of FIG. 4 can be coupled to programmable mode register bits or environmental detection circuits.

As has been described, the present invention provides a selectable interface for interfacing integrated circuit modules.

While the invention has been particularly shown and described with reference to a preferred embodiment, it will be understood by those skilled in the art that various changes in form and detail may be made therein without departing from the spirit and scope of the invention.

What is claimed is:

1. A bus interface for interconnecting a first circuit module and a second circuit module, said bus interface comprising:

a transmitter pair located within said first circuit module for transmitting data from said first circuit module to said second circuit module, wherein said transmitter pair is selectable between a differential mode and a single-ended mode; and a receiver pair located within said second circuit module for receiving data from said transmitter pair, wherein said receiver pair includes a plurality of receivers arranged in pairs, wherein said receiver pair further includes a plurality of differential comparators and multiplexors, wherein said multiplexors are capable of being selected between said differential mode and said single-ended mode, and wherein said receiver pair is also selectable between said differential mode and said single-ended mode.

2. The bus interface of claim 1, wherein said transmitter pair further includes two latches and a multiplexor, wherein said multiplexor is capable of being selected between said differential mode and said single-ended mode.

3. The bus interface of claim 1, wherein said bus interface further includes:

a data clock input for receiving a data clock from said first circuit module; and at least one output driver coupled to said data clock input for transmitting said clock input to said second circuit module.

4. The bus interface of claim 1, wherein said transmitter pair further includes output drivers with adjustable pre-compensation, wherein said pre-compensation is adjusted in conformity with one of said selected mode.

* * * * *